US012672300B2

(12) United States Patent
Pawlak et al.

(10) Patent No.: US 12,672,300 B2
(45) Date of Patent: Jun. 30, 2026

(54) NANOSHEET STRUCTURES WITH CORNER SPACER

(71) Applicant: GlobalFoundries U.S. Inc., Malta, NY (US)

(72) Inventors: Bartlomiej J. Pawlak, Leuven (BE); Judson R. Holt, Ballston Lake, NY (US)

(73) Assignee: GLOBALFOUNDRIES U.S. Inc, Malta, NY (US)

( * ) Notice: Subject to any disclaimer, the term of this patent is extended or adjusted under 35 U.S.C. 154(b) by 371 days.

(21) Appl. No.: 18/354,405

(22) Filed: Jul. 18, 2023

(65) Prior Publication Data

US 2025/0031401 A1     Jan. 23, 2025

(51) Int. Cl.
| | |
|---|---|
| *H10D 30/43* | (2025.01) |
| *H10D 30/01* | (2025.01) |
| *H10D 30/67* | (2025.01) |
| *H10D 62/10* | (2025.01) |
| *H10D 64/01* | (2025.01) |

(52) U.S. Cl.
CPC ........... *H10D 30/43* (2025.01); *H10D 30/014* (2025.01); *H10D 30/6735* (2025.01); *H10D 62/121* (2025.01); *H10D 64/018* (2025.01)

(58) Field of Classification Search
CPC .. H10D 30/43; H10D 30/014; H10D 30/6735; H10D 62/121; H10D 64/018; H10D 30/6757; H10D 62/364; H10D 62/151; H10D 62/116; H10D 64/017; B82Y 10/00
See application file for complete search history.

(56) References Cited

U.S. PATENT DOCUMENTS

| | | | | |
|---|---|---|---|---|
| 9,947,804 | B1 * | 4/2018 | Frougier | H10D 30/6743 |
| 10,170,638 | B1 * | 1/2019 | Reznicek | H10D 62/151 |
| 10,269,983 | B2 | 4/2019 | Frougier et al. | |
| 10,629,679 | B2 * | 4/2020 | Yang | B82Y 10/00 |
| 12,148,836 | B2 * | 11/2024 | Wang | H10D 30/6713 |
| 12,211,895 | B2 * | 1/2025 | Yang | H10D 30/031 |
| 2019/0157386 | A1 * | 5/2019 | Ando | H01L 21/02546 |
| 2019/0221638 | A1 * | 7/2019 | Reznicek | H10D 30/6212 |
| 2020/0279913 | A1 * | 9/2020 | Ebrish | H10D 84/834 |
| 2020/0312956 | A1 * | 10/2020 | Yeh | H10D 64/018 |
| 2021/0351079 | A1 * | 11/2021 | Su | H10D 84/0149 |

(Continued)

OTHER PUBLICATIONS

The Partial European Search Report and Opinion dated Jul. 18, 2024 in EP Application No. 24151998.2-1211, 13 pages.

(Continued)

*Primary Examiner* — Yara B Green
*Assistant Examiner* — Akhee Sarker-Nag
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to nanosheet transistor structures and methods of manufacture. The structure includes: a plurality of stacked semiconductor nanosheets over a semiconductor substrate; a plurality of gate structures surrounding individual nanosheets of the plurality of semiconductor nanosheets; an inner sidewall spacer adjacent each of the plurality of gate structures; and corner spacers under the plurality of stacked semiconductor nanosheets.

20 Claims, 7 Drawing Sheets

(56)          References Cited

U.S. PATENT DOCUMENTS

| | | | | |
|---|---|---|---|---|
| 2022/0416056 A1* | 12/2022 | Zhang | ................. | H10D 62/116 |
| 2024/0038842 A1* | 2/2024 | Chun | ................... | H10D 62/151 |
| 2025/0006811 A1* | 1/2025 | Lin | ..................... | H10D 30/508 |

OTHER PUBLICATIONS

The Extended European Search Report and Opinion dated Aug. 26, 2024 in EP Application No. 24151998.2-1211, 14 pages.
Jeong et al., "Novel Trench Inner-Spacer Scheme to Eliminate Parasitic Bottom Transistors in Silicon Nanosheet FETs", IEEE Transactions on Electron Devices, vol. 70, No. 2, Feb. 2023, 6 pages.
Yoon et al., "Punch-Through-Stopper Free Nanosheet FETs With Crescent Inner-Spacer and Isolated Source/Drain", IEEE, Mar. 14, 2019, 4 pages.
Davis, "IBM Announces 2nm GAA-FET Technology—the Sum of "Aha!" Moments", Semiconductor Digest, Jun. 3, 2021, 11 pages.
Horiguchi, "Entering the nanosheet transistor era", Imec, www.imce-int.com, Feb. 11, 2022, 34 pages.
Dahad, "Air Spacers and Stacked GAA Nanosheets Drive Performance", EE Times, Jun. 30, 2020, 7 pages.
Lee et al., "Inner Spacer Engineering to Improve Mechanical Stability in Channel-Release Process of Nanosheet FETs", MDPI, Jun. 10, 2021, issue 12, vol. 10, 21 pages.

* cited by examiner

NANOSHEET STRUCTURES WITH CORNER SPACER

BACKGROUND

The present disclosure relates to semiconductor structures and, more particularly, to nanosheet transistor structures with corner spacers and methods of manufacture.

Gate-All-Around (GAA) nanosheet field effect transistors (FETs) include stacks of nanosheets or nanowires with spacers that are surrounding the full perimeter of multiple nanosheet channel regions with a metal gate stack. Nanosheet transistors have increased performance over planar transistors by providing increased device density and performance.

SUMMARY

In an aspect of the disclosure, a structure comprises: a plurality of stacked semiconductor nanosheets over a semiconductor substrate; a plurality of gate structures surrounding individual nanosheets of the plurality of semiconductor nanosheets; an inner sidewall spacer adjacent each of the plurality of gate structures; and corner spacers under the plurality of stacked semiconductor nanosheets.

In an aspect of the disclosure, a structure comprises: a fin structure comprising semiconductor material and at least one gate structure; a source region on a first side of the at least one gate structure; a drain region on a second side of the at least one gate structure; and corner spacers under the fin structure, the source region and the drain region.

In an aspect of the disclosure, a method comprises: forming a plurality of stacked semiconductor nanosheets over a semiconductor substrate; forming a plurality of gate structures surrounding individual nanosheets of the plurality of semiconductor nanosheets; forming an inner sidewall spacer adjacent each of the plurality of gate structures; and forming corner spacers under the plurality of stacked semiconductor nanosheets.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to nanosheet field effect transistors (FET). More specifically, the present disclosure comprises nanosheet transistor structures with bottom corner spacers and methods of manufacture. In embodiments, the bottom corner spacers may be provided under a lowest channel region, on both a source side and drain side of the device. Advantageously, the structures and processes described herein suppress sub-FIN leakage while also maintaining channel strain through a source and drain epitaxial regrowing process.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
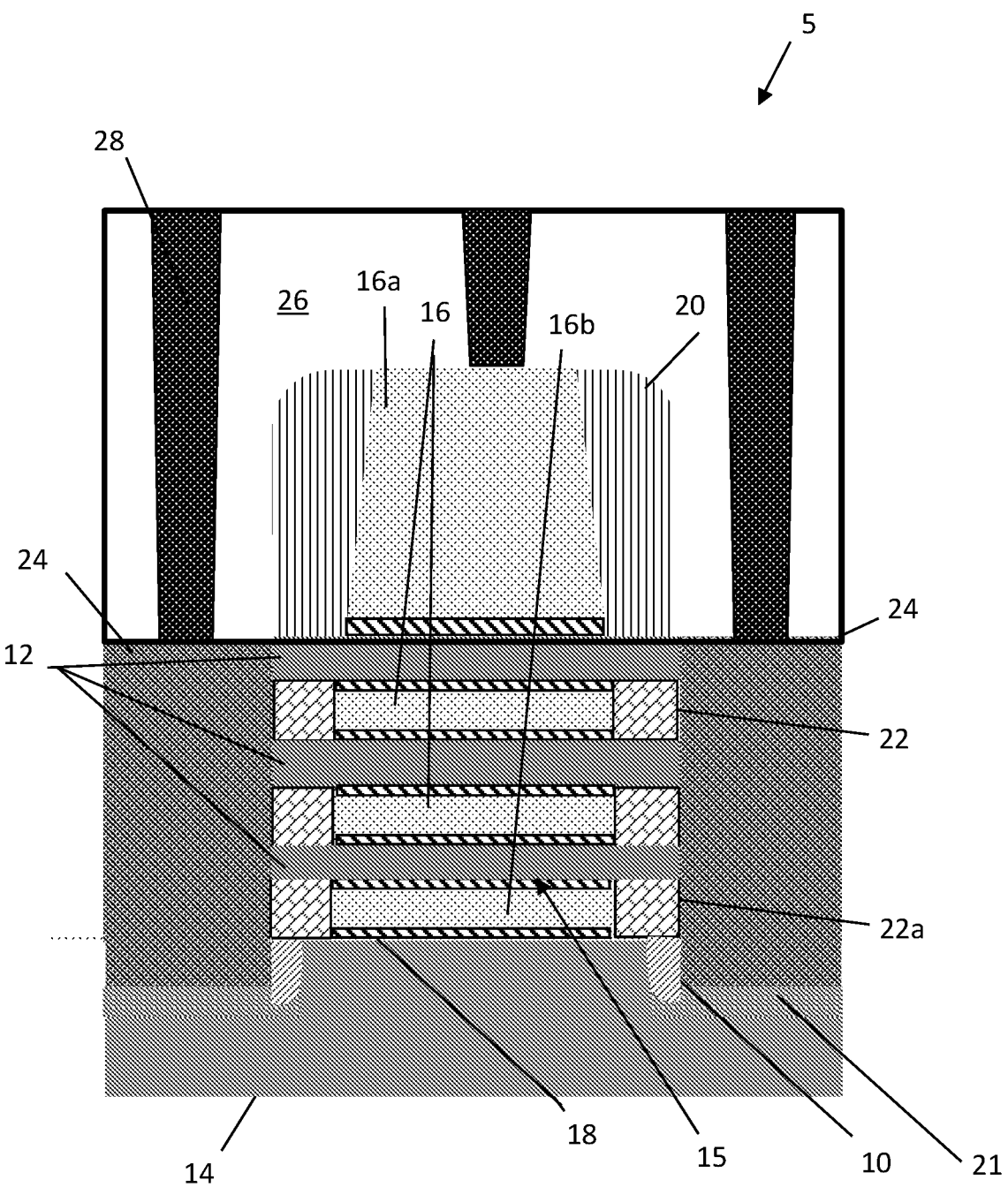
FIG. 1 shows a cross-sectional view of a nanosheet field effect transistor (FET) in accordance with aspects of the present disclosure.

FIG. 1 shows a cross-sectional view of a nanosheet FET in accordance with aspects of the present disclosure. In embodiments, the nanosheet FET 5 of FIG. 1 includes bottom corner spacers 10, underneath a plurality of nanosheets 12. In embodiments, the bottom corner spacers 10 may be provided within a semiconductor substrate 14 at a corner of the stack of nanosheets 12, below the bottommost channel region 15 (e.g., below the lowest nanosheet) and source/drain regions 24. In embodiments, the bottom corner spacers 10 also separate and are between the source/drain regions 24.

It should be understood by those of skill in the art that the stack of nanosheets 12 (and respective gate structures 16, 16a, 16b) may equally represent a fin structure for a FinFET. In any of the contemplated configurations, the bottom corner spacers 10 will suppress sub-FIN leakage while also maintaining channel strain through a source and drain epitaxial regrowing process. This is compared to conventional structures which exhibit losses in performance at the bottom of the device.

More specifically, the nanosheet FET 5 includes a plurality of stacked nanosheets 12 disposed over the semiconductor substrate 14. In embodiments, each of the nanosheets 12 acts as a channel region for respective gate structures 16, 16a, 16b which wrap around each of the stacked nanosheets 12. Although three nanosheets 12 are shown stacked together with a respective number of wraparound gate structures 16, 16a, 16b, it should be understood that more or less than three nanosheets are contemplated herein.

The semiconductor substrate 14 and stacked nanosheets 12 may be composed of any suitable semiconductor material including, but not limited to, Si, SiGe, SiGeC, SiC, GaAs, InAs, InP, InGaAs and other III/V or II/VI compound semiconductors. The semiconductor substrate 14 and stacked nanosheets 12 may also comprise any suitable single crystallographic orientation (e.g., a (100), (110), (111), or (001) crystallographic orientation).

In embodiments, the semiconductor substrate 14 may be a single semiconducting material such as bulk substrate comprising the semiconductor materials described herein. Alternatively, the semiconductor substrate 14 may comprise semiconductor on insulator technology. The semiconductor on insulator technology may include, from bottom to top, a handle wafer, an insulator layer and the semiconductor substrate 14 on top of the insulator layer. The insulator layer may comprise any suitable material, including silicon oxide, sapphire, other suitable insulating materials, and/or combinations thereof. An exemplary insulator layer may be a buried oxide layer (BOX). The insulator layer is formed by any suitable process, such as separation by implantation of oxygen (SIMOX), oxidation, deposition, and/or other suitable processes. The handle wafer may comprise any suitable semiconductor material as already described herein, and may be used as a support for the insulator layer and the semiconductor substrate 12.

Still referring to FIG. 1, gate structure 16a may be provided on an upper nanosheet, with wraparound gate structures 16, 16b wrapping around each of the nanosheets 12. The lower gate structure 16b may be provided over the semiconductor substrate 14. The gate structures 16, 16a, 16b may be metal gate structures composed of appropriate workfunction metals. For example, the gate workfunction metal may include, for example, Ti, TiAlC, Al, TiAl, TaN, TiN, TiC, Co, TiC, TaC, HfTi, TiSi, or TaSi. The workfunction material may be formed by CVD, physical vapor deposition (PVD), including sputtering, atomic layer deposition (ALD) or other suitable method as is known in the art. Alternatively, the gate structures 16, 16a, 16b may be polysilicon material.

The gate structures 16, 16a, 16b include gate dielectric material 18 surrounding each of the nanosheets 12 and over the semiconductor substrate 14. The gate dielectric material 18 may be high-k dielectric material provided on a surface of the semiconductor substrate 14 and which wraps around each of the nanosheets 12. In embodiments, the high-k dielectric material may be, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

Still referring to FIG. 1, a sidewall spacer 20 surrounds the gate structure 16a and inner sidewall spacers 22 surround the respective wraparound gate structures 16, 16b. The inner sidewall spacers 22 may be provided between the nanosheets 12, in addition to between the lowest nanosheet and the semiconductor substrate 14. The sidewall spacer 20 may be SiN, for example. The inner sidewall spacers 22 may also be composed of SiN or other low-k dielectric materials such as SiOCN, SiBCN, etc.

FIG. 1 further shows raised source/drain regions 24. The raised source/drain regions 24 may be epitaxial semiconductor material, selectively grown from the semiconductor substrate 14 and the stacked nanosheets 12. In embodiments, the epitaxial semiconductor material may be silicon germanium (SiGe) or SiP, as examples. The raised source/drain regions 24 may be isolated from the gate structures 16, 16b by the inner sidewall spacers 22. The source/drain regions 24 may be in-situ doped with an appropriate dopant for an NFET device or PFET device as is understood by those of skill in the art such that no further explanation is required for a complete understanding of the present disclosure. Alternatively, the raised source/drain regions 24 may be subjected to an ion implantation process as is known in the art.

In embodiments, the semiconductor substrate 14 may include a counter doped region 21. In embodiments, the counter doped region 21 may be formed by, e.g., ion implantation processes, with a conductivity type opposite to the raised source/drain regions 24. By way of example, the semiconductor substrate 14 may be a p-type substrate with the counter doping being also a p-type dopant (e.g., Boron); whereas the source/drain regions 24 may be an n-type dopant (e.g., Arsenic, Phosphorus or Antimony). In embodiments, the counter doped region 21 may be spaced out from the gate structures, under the source/drain regions 24. In further embodiments, the counter doped region 21 may be adjacent to the bottom corner spacers 10, and may partially overlap with the bottom corner spacers 10.

FIG. 1 further shows the bottom corner spacers 10 within the semiconductor substrate 14. The bottom corner spacers 10 may be provided at the corners of the stacked nanosheets 12 and respective gate structures 16, 16a, 16b, between and separating the source/drain regions 24. In embodiments, the bottom corner spacers 10 separates the source region from the drain region which helps in the suppression of sub-FIN leakage. The bottom corner spacers 10 may be SiN, $SiO_2$ or other low-k dielectric materials such as SiOCN, SiBCN, etc.

The bottom corner spacers 10 may extend underneath the bottom most inner spacers 22a. The bottom corner spacers 10 may also extend to different distances underneath the bottommost inner spacers 22a, depending on the desired device performance and characteristics. For example, the bottom corner spacers 10 may extend fully underneath the bottommost inner spacers 22a and, in embodiments, can also reach underneath the bottommost gate structure 16b. Also, in this embodiment, the bottom corner spacers 10 will have an outer vertical sidewall that is aligned with the outside vertical sidewall of the bottommost inner spacers 22a. The location of the bottom corner spacers 10 will allow the epitaxial growth process of the source/drain regions 24. For example, the bottom corner spacers 10 will only partially extend into the source region and the drain region so as to allow the epitaxial growth process from the semiconductor substrate 14.

Still referring to FIG. 1, interlevel dielectric material 26 may be deposited over the structures, with contacts 28 formed to the gate structure 16a and the raised source/drain regions 24. In embodiments, the interlevel dielectric material 26 may be an oxide material, nitride material, or combination of layers of the oxide material and the nitride material. Prior to forming the contacts to the raised source/drain regions 24, a silicide process may be performed to form silicide contacts on the raised source/drain regions 24 as described further herein.

Figure 2:
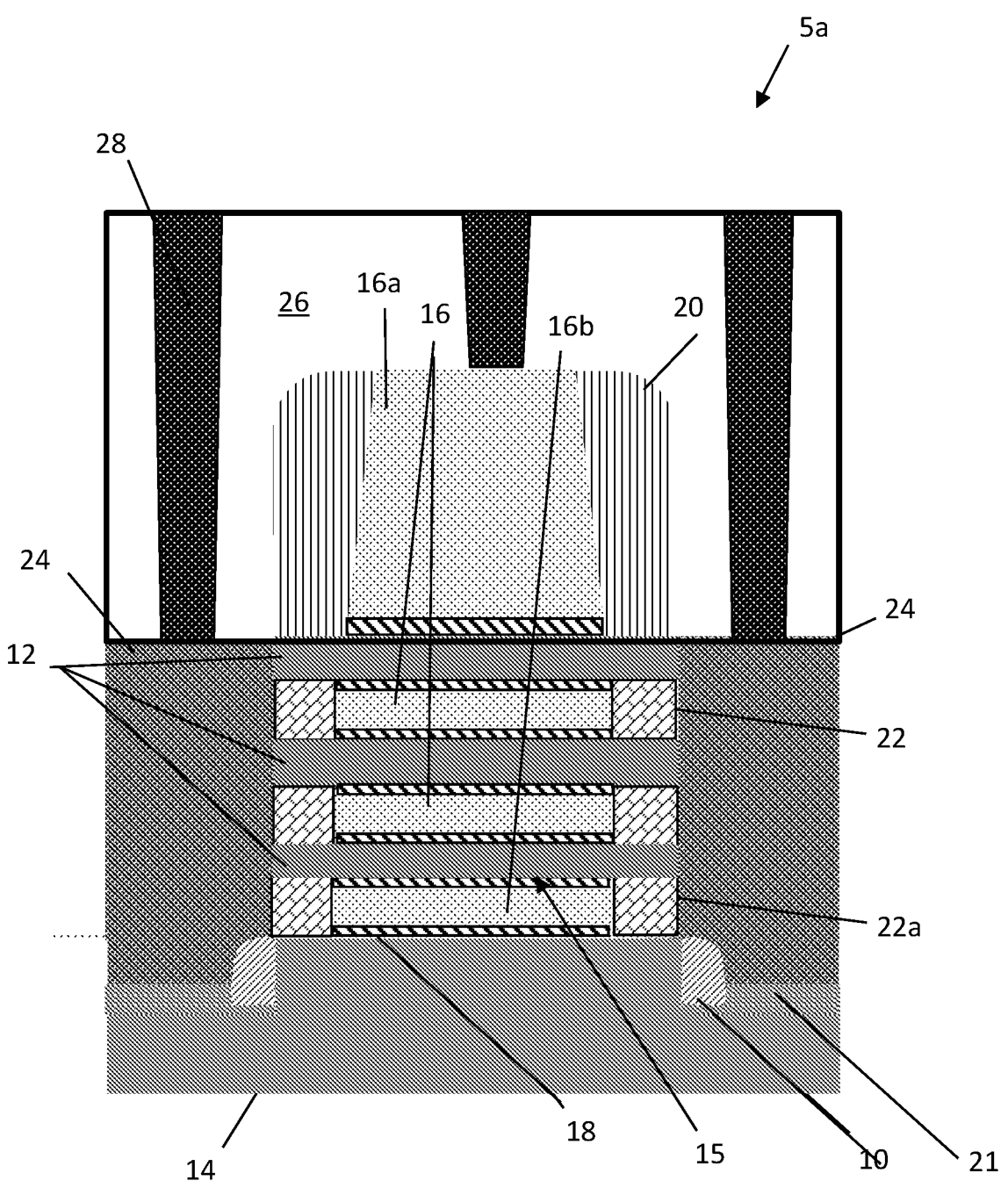
FIG. 2 shows a cross-sectional view of a nanosheet field effect transistor (FET) in accordance with additional aspects of the present disclosure.

FIG. 2 shows a cross-sectional view of a nanosheet field effect transistor (FET) in accordance with additional aspects of the present disclosure. In the structure 5a, the bottom corner spacers 10 may extend on the sides of bottom most inner spacers 22a. Specifically, in this configuration, the bottom corner spacers 10 will have an inner vertical sidewall that is aligned with the outside vertical sidewall of the bottommost inner spacers 22a. The remaining features are the same as the structure 5 of FIG. 1.

Figure 3A:
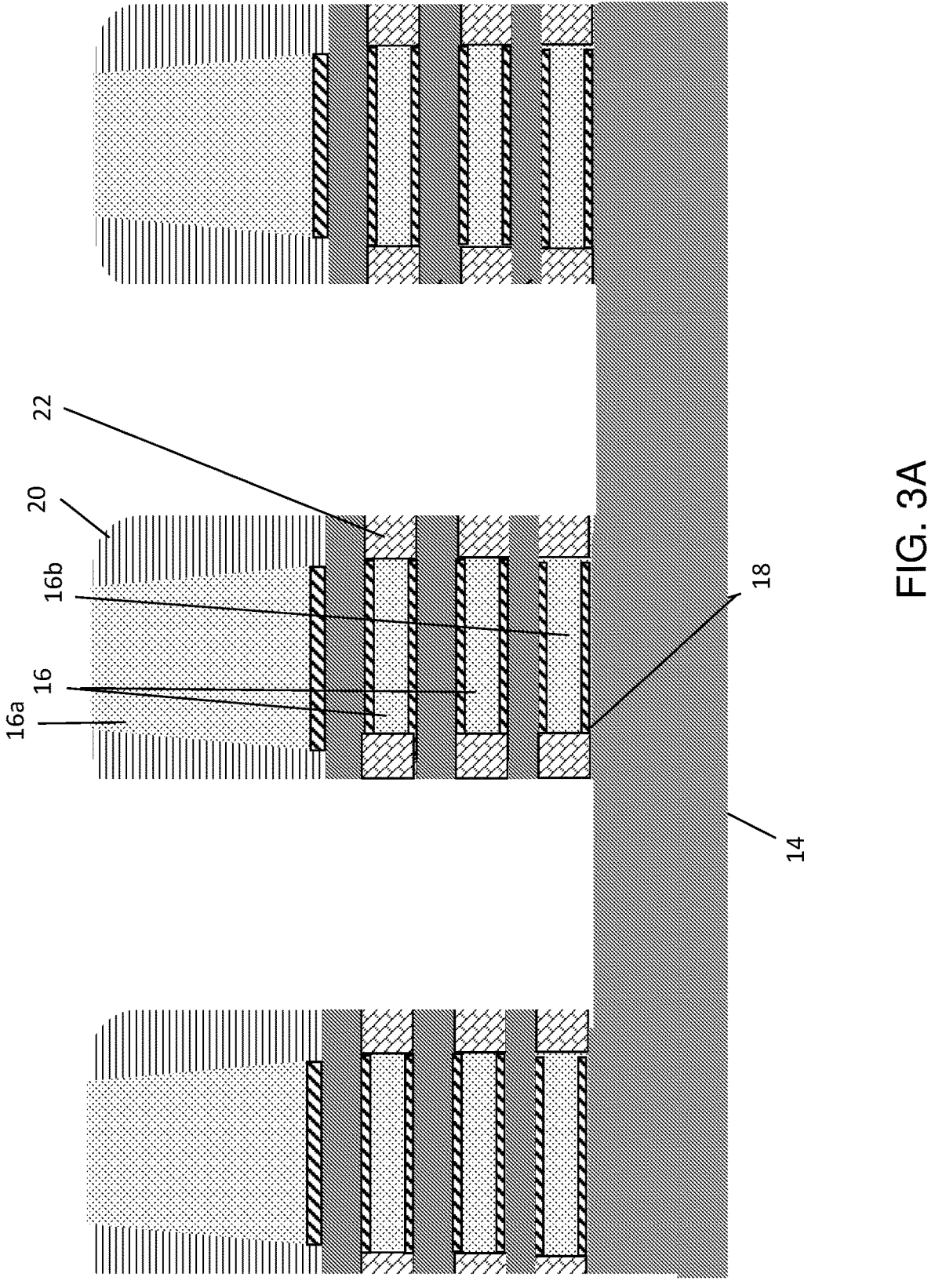
FIGS. 3A-3E show cross-sectional views of respective fabrication processes of a nanosheet FET in accordance with aspects of the present disclosure.

FIGS. 3A-3E show cross-sectional views of respective fabrication processes of a nanosheet FET in accordance with aspects of the present disclosure. For example, FIG. 3A shows a plurality of fin structures each of which comprises the stacked nanosheets 12, respective gate structures 16, 16a, 16b and accompanying gate dielectric material 18, the inner sidewall spacers 22 and spacers 20. The stacked nanosheets 12, respective gate structures 16, 16a, 16b and accompanying gate dielectric material 18, the inner sidewall spacers 22 and spacers 20 may be formed in a conventional manner using, e.g., deposition, lithography and patterning (e.g., etching) steps as is known in the art such that no further explanation is required for a complete understanding of the present invention. For example, the deposition processes may be, e.g., chemical vapor deposition (CVD), atomic layer deposition (ALD), plasma enhanced (PE) CVD, etc., and the etching processes may be, for example, conventional reactive ion etching (RIE) processes with known selective chemistries to the different materials.

Figure 3B:
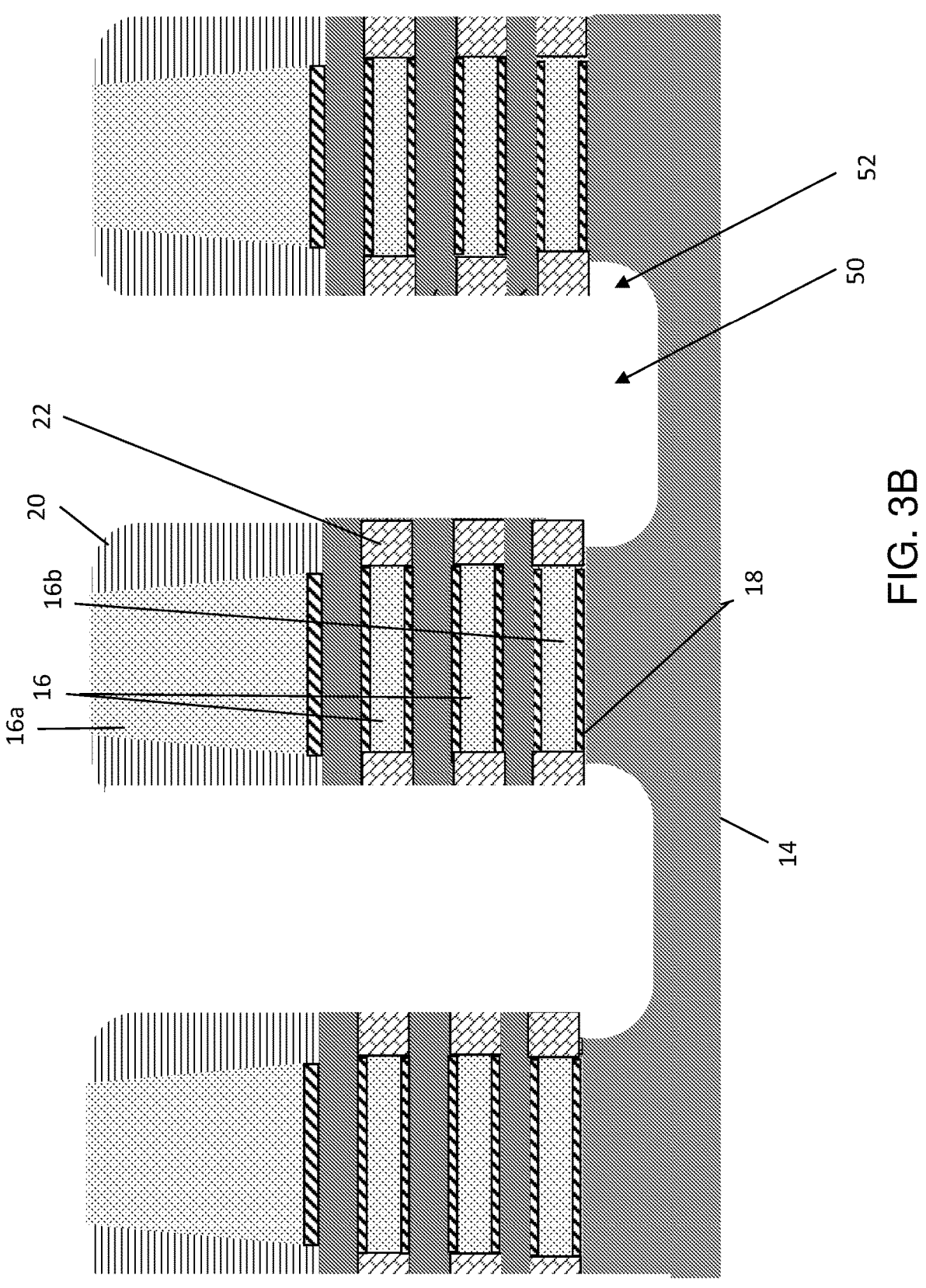

In FIG. 3B, a trench 50 is formed in the semiconductor substrate 14, between each of fin structures. The trench 50 may include a recess or undercut 52 that extends partially under the inner spacers 22. In alternative embodiments, the recess or undercut 52 of the trench 50 may extend underneath the bottommost gate structure 16b (or other dimensions). The trench 50 may be formed by conventional lithography and etching processes, with an over etch process, e.g., timed etch, to form the recess or undercut 52. For example, the etching process may be a timed isotropic etching process to provide the recess or undercut 52 extending partially or fully under the inner spacers 22 or, for another example, underneath the bottommost gate structure 16b.

Figure 3C:
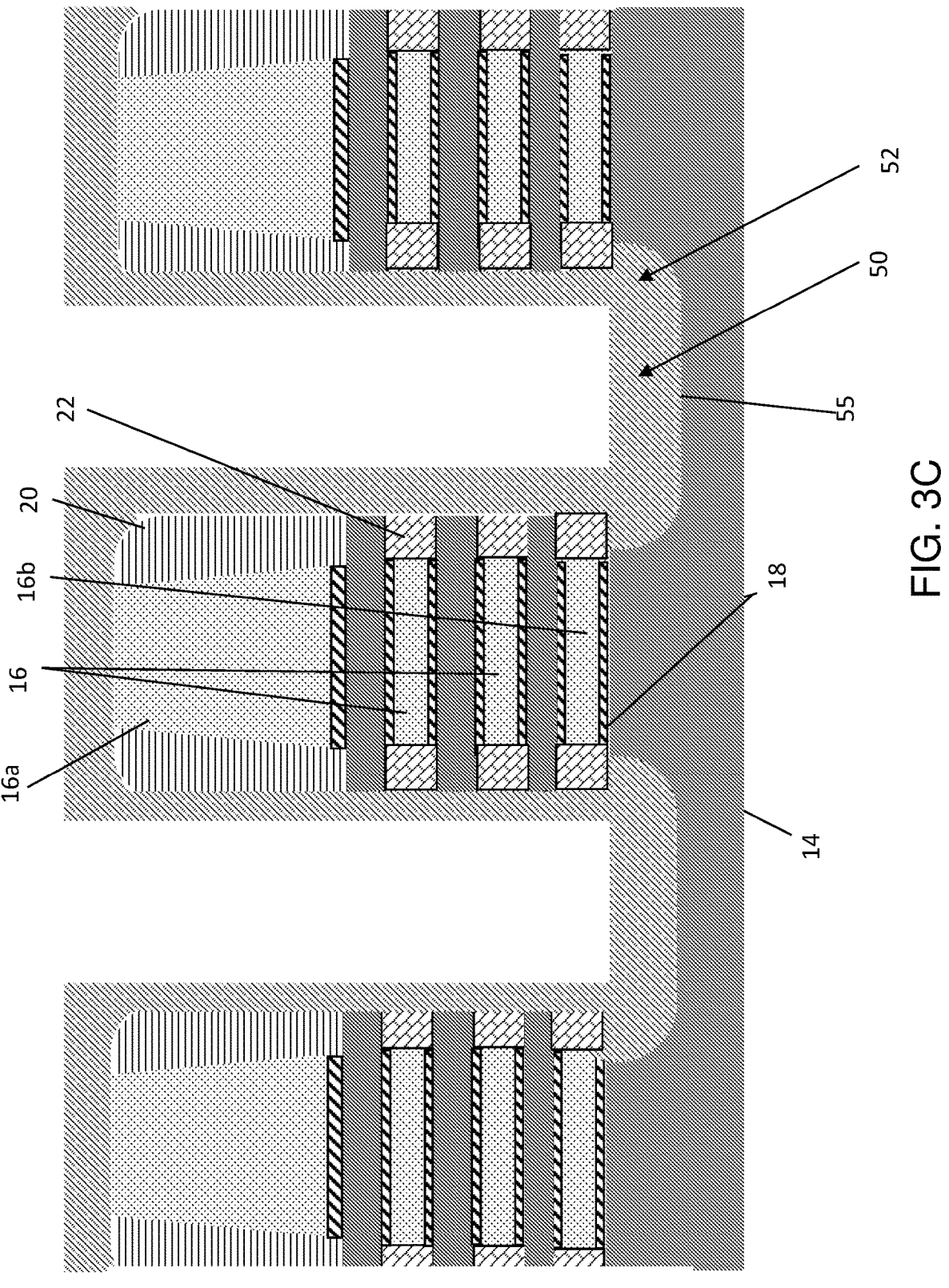

In FIG. 3C, a spacer material 55 may be formed in the trench 50, in addition to over each of the fin structures. In embodiments, the spacer material 55 may be deposited by a conventional CVD process. The spacer material 55 may be SiN, $SiO_2$ or other low-k dielectric materials such as SiOCN, SiBCN, etc. In embodiments, the spacer material 55 may completely fill the trench 50 including the recess or undercut 52.

Figure 3D:
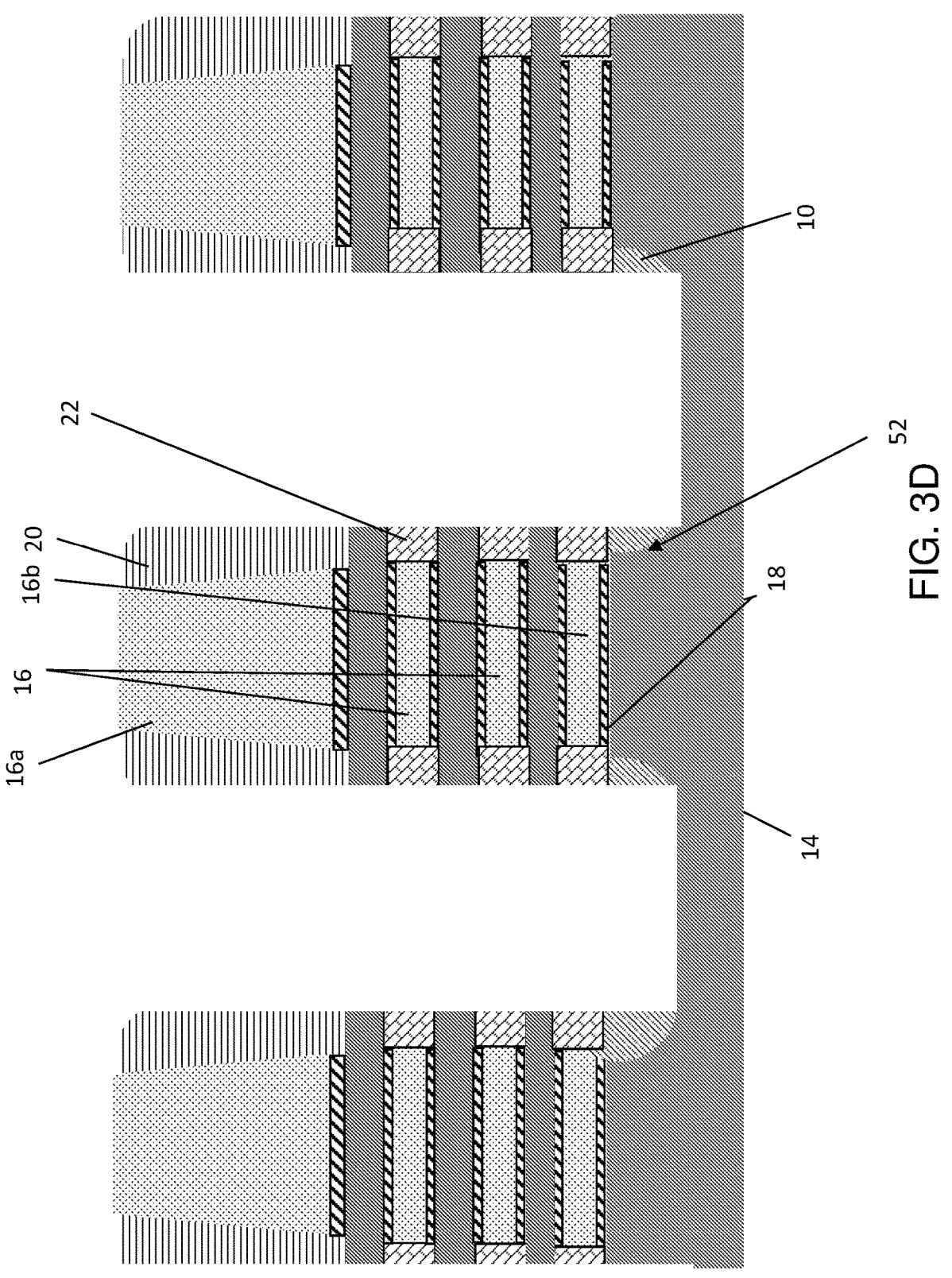

As shown in FIG. 3D, the spacer material 55 is removed from the surfaces of the fin structures and partially removed from the trench 50. In this way, the spacer material will remain within the recess or undercut 52, thereby forming the bottom corner spacers 10. More specifically and by way of example, the spacer material 55 may be removed by a timed etching process to expose the sides of the nanosheets 12 and underlying semiconductor substrate 14, while maintaining (e.g., leaving behind) the spacer material 55 within the recess or undercut 52. In this way, the bottom corner spacers 10 may extend partially or fully under the inner spacers 22 or, alternatively, may extend to underneath the bottommost gate structure 16b.

Figure 3E:
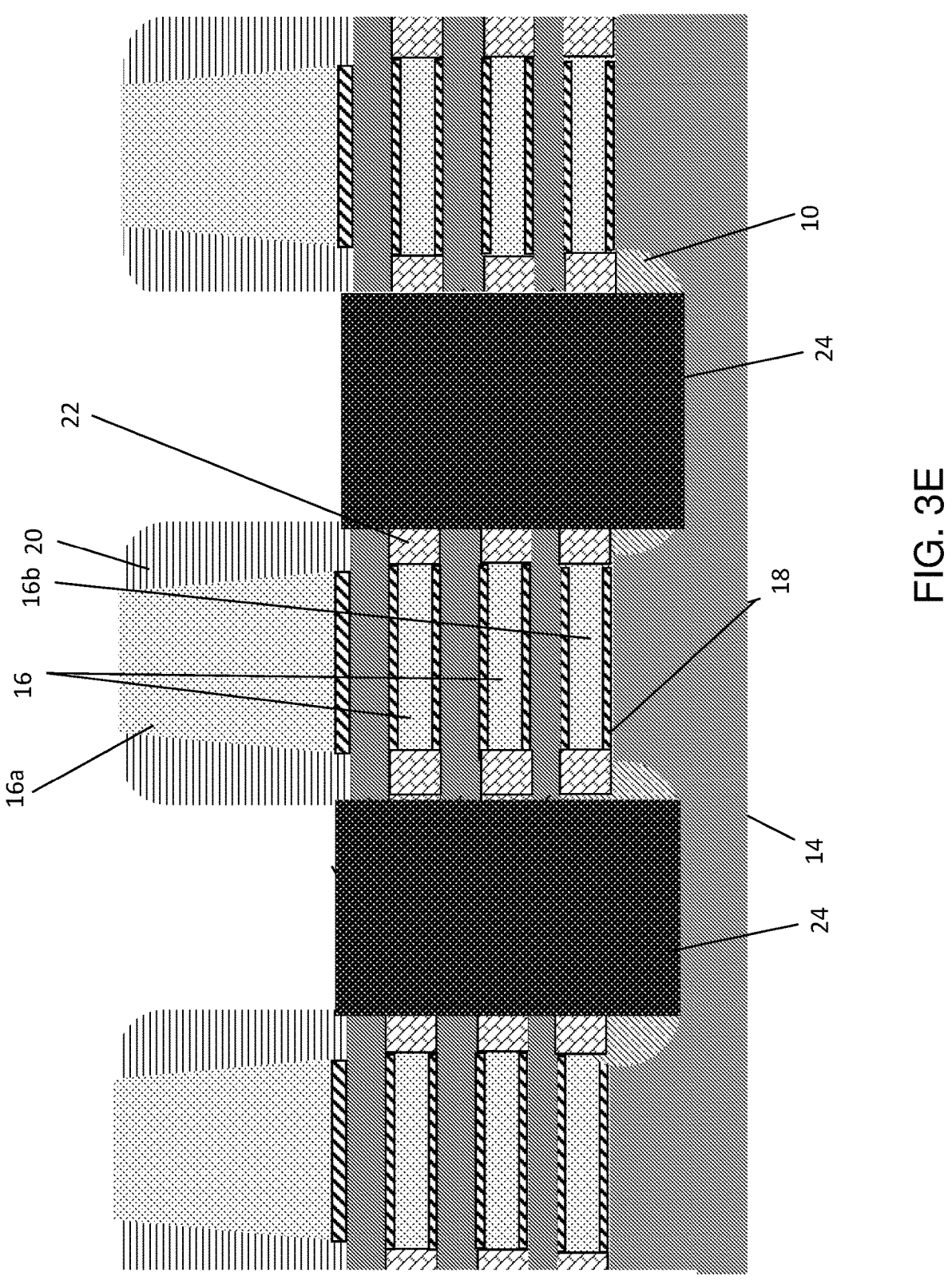

In FIG. 3E, the source/drain regions 24 are formed between the fin structures. In embodiments, the source/drain regions 24 are raised source/drain regions formed by conventional epitaxial growth processes starting from the exposed underlying semiconductor material 14 and each of the exposed nanosheets 12. The source/drain regions 24 may be in-situ doped with an appropriate dopant for an NFET device or PFET device as is understood by those of skill in the art. Alternatively, the raised source/drain regions 24 may be subjected to an ion implantation process as is known in the art. The semiconductor substrate 14 may also be subjected to a counter doping process, e.g., ion implant with a conductivity type opposite to the raised source/drain regions 24.

Referring back to FIG. 1, interlevel dielectric material 26 may be deposited by a conventional CVD process. Following the deposition process, the interlevel dielectric material 26 may be subjected to a patterning process to form vias extending to the raised source/drain regions 24 and the gate structures 16, 16a, 16b. In the cross-sectional view shown, the via is shown extending to the gate structure 16a. The contacts 28 may be formed to the gate structures and the raised source/drain regions 24.

The vias may be formed by conventional lithography and etching processes. For example, a resist formed over the interlevel dielectric material 26 is exposed to energy (light) and developed utilizing a conventional resist developer to form a pattern (opening). An etching process with a selective chemistry, e.g., RIE, will be used to transfer the pattern from the patterned photoresist layer to the interlevel dielectric material 26 to form one or more vias in the interlevel dielectric material 26. Following the resist removal by a conventional oxygen ashing process or other known stripants, a silicide process may be performed.

Prior to forming the contacts to the raised source/drain regions 24 and gate structure 16a (should the gate structure be composed of polysilicon), a silicide process may be performed to form silicide contacts on the raised source/drain regions 24. As should be understood by those of skill in the art, the silicide process begins with deposition of a thin transition metal layer, e.g., nickel, cobalt or titanium, over fully formed and patterned semiconductor devices (e.g., source/drain regions). After deposition of the material, the structure is heated allowing the transition metal to react with exposed silicon (or other semiconductor material as described herein) in the active regions of the semiconductor device (e.g., source/drain region) forming a low-resistance transition metal silicide. Following the reaction, any remaining transition metal is removed by chemical etching, leaving silicide contacts in the active regions of the device. It should be understood by those of skill in the art that silicide contacts will not be required on the metal gate structures.

Following the silicide process, the contacts 28 may be formed by conventional deposition processes within the vias or trenches, followed by a planarization process (e.g., chemical mechanical planarization (CMP). In embodiments, the contacts 28 may be tungsten or other appropriate metal material, e.g., aluminum, copper, etc. A TiN or TaN liner may also be used prior to the deposition of the tungsten.

The structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a plurality of stacked semiconductor nanosheets over a semiconductor substrate;
   a plurality of gate structures surrounding individual nanosheets of the plurality of semiconductor nanosheets;
   an inner sidewall spacer adjacent each of the plurality of gate structures; and
   corner spacers under the plurality of stacked semiconductor nanosheets,
   wherein the corner spacers have an outer vertical sidewall which is entirely aligned with an outside vertical sidewall of the inner sidewall spacer and an inner vertical sidewall which is non-aligned in a vertical direction with an inner vertical sidewall of the inner sidewall spacer.

2. The structure of claim 1, wherein the corner spacers comprise insulator material.

3. The structure of claim 1, wherein the corner spacers extend partially underneath a bottommost inner sidewall spacer.

4. The structure of claim 1, wherein the corner spacers extend underneath the bottommost inner sidewall spacer.

5. The structure of claim 1, wherein the corner spacers extend to underneath the plurality of gate structures.

6. The structure of claim 1, further comprising source/drain regions on opposing sides of the plurality of gate structures, wherein the corner spacers are between the source/drain regions.

7. The structure of claim 6, wherein the corner spacers are within the semiconductor substrate.

8. The structure of claim 7, wherein the corner spacers are below the source/drain regions.

9. The structure of claim 6, further comprising a counter doped region under the source/drain regions, and the counter doped region has a conductivity type which is opposite to the source/drain regions.

10. The structure of claim 9, wherein the counter doped region is below the corner spacers.

11. The structure of claim 1, wherein the corner spacers extend below a bottommost channel region comprising a bottommost semiconductor nanosheet of the plurality of stacked semiconductor nanosheets.

12. The structure of claim 1, further comprising a counter doped region which partially overlaps with the corner spacers.

13. A structure comprising:
    a fin structure comprising at least one gate structure;
    a source region on a first side of the at least one gate structure;

a drain region on a second side of the at least one gate structure; and
    corner spacers below the fin structure, the source region and the drain region,
    wherein the corner spacers have an outer vertical sidewall which is entirely vertically aligned with an outside vertical sidewall of the inner sidewall spacer and have an inner vertical sidewall which is non-aligned in a vertical direction with an inner vertical sidewall of the inner sidewall spacer.

14. The structure of claim 13, wherein the fin structure is above semiconductor material, and the corner spacers comprise insulator material within the semiconductor material.

15. The structure of claim 13, wherein the fin structure comprises a plurality of stacked semiconductor nanosheets, the at least one gate structure comprises a plurality of gate structures wrapping around individual semiconductor nanosheets of the stacked semiconductor nanosheets, and the source region and the drain region are raised regions adjacent to the plurality of gate structures.

16. The structure of claim 15, further comprising inner spacers adjacent to each of the plurality of gate structures and between the semiconductor nanosheets, the inner spacers separating each of the plurality of gate structures from the source region and from the drain region, and the corner spacers extend at least partially underneath a bottommost inner spacer of the inner spacers.

17. The structure of claim 16, wherein the corner spacers extend to underneath the plurality of gate structures.

18. The structure of claim 16, further comprising a counter doped region under the source region and the drain region, and the counter doped region has a conductivity type which is opposite to the source region and the drain region.

19. The structure of claim 18, wherein the counter doped region partially overlaps with the corner spacers, and the counter doped region is below the corner spacers.

20. A method comprising:
    forming a plurality of stacked semiconductor nanosheets over a semiconductor substrate;
    forming a plurality of gate structures surrounding individual nanosheets of the plurality of semiconductor nanosheets;
    forming an inner sidewall spacer adjacent each of the plurality of gate structures; and
    forming corner spacers under the plurality of stacked semiconductor nanosheets,
    wherein the corner spacers have an outer vertical sidewall which is entirely aligned with an outside vertical sidewall of the inner sidewall spacer and an inner vertical sidewall which is non-aligned in a vertical direction with an inner vertical sidewall of the inner sidewall spacer.

* * * * *